United States Patent [19]
Kataoka

[11] Patent Number: 6,031,370
[45] Date of Patent: Feb. 29, 2000

[54] SEMICONDUCTOR TESTING APPARATUS

[75] Inventor: Keiju Kataoka, Tokyo, Japan

[73] Assignee: Ando Electric Co., Ltd., Tokyo, Japan

[21] Appl. No.: 09/013,319

[22] Filed: Jan. 26, 1998

[30] Foreign Application Priority Data

Jan. 28, 1997 [JP] Japan .................................. 9-014349

[51] Int. Cl.$^7$ .................................................. G01R 31/02
[52] U.S. Cl. ...................... 324/158.1; 324/73.1; 324/537
[58] Field of Search ................. 324/158.1, 73.1, 324/537, 765; 363/15, 34, 64, 65; 714/736, 737

[56] References Cited

U.S. PATENT DOCUMENTS

| | | | |
|---|---|---|---|
| 3,824,441 | 7/1974 | Heyman et al. | 363/34 |
| 4,180,203 | 12/1979 | Masters | 324/73.1 |
| 4,637,020 | 1/1987 | Schinabeck | 714/736 |
| 4,656,632 | 4/1987 | Jackson | 324/73.1 |
| 5,101,153 | 3/1992 | Morong, III | 324/537 |
| 5,424,934 | 6/1995 | Tanuma et al. | 363/65 |

FOREIGN PATENT DOCUMENTS

| | | |
|---|---|---|
| 59-23673 | 2/1984 | Japan . |
| 3-293571 | 12/1991 | Japan . |
| 5-297962 | 11/1993 | Japan . |

Primary Examiner—Ernest Karlsen
Attorney, Agent, or Firm—Fish & Richardson P.C.

[57] ABSTRACT

A semiconductor testing apparatus is disclosed which is able to lower the cost of a facility by using a power supply cable of narrow gauge, and to control the level of the power supply cable of every pin electronic circuit. A high DC voltage transformer G transforms the commercial AC power supply voltage into high DC voltage. Low DC voltage trabsformers B, B1, B2 receive said high DC voltage via power cables 2, 21, 22 and transform the high DC voltage into the required low DC voltage. The pin electronic circuits D, D1, D2 are connected to said low DC voltage trabsformers B, B1, B2. The circuits B, B1, B2 receive the above low DC voltage and supply the testing output signals to the semiconductor devices E, E1, E2 being tested.

6 Claims, 5 Drawing Sheets

SEMICONDUCTOR TESTING APPARATUS

BACKGROUND OF THE INVENTION

1. Field of the Invention

The present invention relates to a semiconductor testing apparatus which is used for simultaneous measuring of the characteristics of a plurality semiconductor devices.

2. Description of Related Art

A conventional semiconductor testing apparatus, as shown in FIG. 4 and FIG. 5, will be explained below. In both figures, low DC voltage transformers A, A1, A2 are provided in main body 7 and transform an AC voltage 200 V into the desired DC voltage. Pin electronic circuits D, D1, D2 supply test signals to each of the semiconductor devices E, E1, E2, and are disposed on a card. Connectors 56 to 61, which are provided on the card, are connected to connectors 5 and 51 to 55, respectively, which are provided on the backboard C.

Further, connectors 3, 31, 32 are provided at the place corresponding to each of the connectors 5, 52, 54 on the back side of the backboard C, to be connected to each of the connectors 5, 52, 54 via circuit patterns 6, 63, 64 on the surface of the backboard C. Test station 8 is comprised of the backboard C, and pin electronic circuit D, D1, D2 which are on the backboard C. In addition, the connectors 3, 31, 32 are connected to the connectors 1, 11, 12 respectively via power cables 2, 21, 22, and the connectors 1, 11, 12 are connected to the connectors 1a, 11a, 12a which are used as the output terminals for the low DC voltage transformers A, A1, A2.

In the conventional semiconductor testing apparatus described above, AC 200 V voltage is transformed into low DC voltages which are required by each of the pin electronic circuits D, D1, D2, and the low DC voltages are transmitted to the power cables 2, 21, 22 via connectors 1a, 11a, 12a and connectors 1, 11, 12. Finally, the low DC voltages are sent to each of the pin electronic circuit D, D1, D2 sequentially and respectively via connectors 3, 31, 32; circuit patterns 6, 63, 64 on the surface of the backboard C; connectors 5, 52, 54 and connectors 56, 58, 60. The connections enable each of the pin electronic circuits D, D1, D2 to supply the testing signals corresponding to each of the semiconductor devices E, E1, E2.

However, there is a problem that in the conventional semiconductor testing apparatus power supplies (for example, different power voltages such as +/−5 V or −2 V) or low DC voltage transformers A, A1, A2 which correspond to the power currents (required currents at each power voltage, such as 10A at +5 V) must be individually arranged.

Another problem in the conventional semiconductor testing apparatus is that the current which is required by the test station 8 increases as the number of semiconductor devices E, E1, E2 being tested increases. Additionally, because of this, a new low DC voltage transformer with a large current capacity is required, and the number and current capacity of the connectors 1, 11, 12; power cables 2, 21, 22; and connectors 3, 31, 32 on the backboard C must be increased. The increase in these power cables 2, 21, 22 prevents the improvement in operation of the test station 8 on the semiconductor testing apparatus and increases layout space for the semiconductor testing apparatus. Also, in the case of the decreasing of the number of semiconductor devices E, E1, E2 being tested at the test station 8, it is difficult in the conventional apparatus to eliminate the low DC voltage transformer A, A1, A2 because those power circuits are shared by each of the pin electronic circuits D, D1, D2.

SUMMARY OF THE INVENTION

It is therefore an object of the present invention to provide a semiconductor testing apparatus which allows increasing or decreasing the number of the power supply lines depending on the number of devices being tested, and decreasing the capacity of the power supply cable by providing a low DC voltage transformer in the test station and power supply lines for every pin electronic circuit.

In order to attain this object, the present invention provides a semiconductor device testing apparatus comprising a high DC voltage transformer which transforms the commercial high AC voltage into high DC voltage and outputs it; a plurality of low DC voltage transformers which receive the high DC voltage which is output by the said high DC voltage transformer via a power cable, and transforms the high DC voltage into the required level of low DC voltage; pin electronic circuits which are connected to each of said low DC voltage transformers receive the low DC voltage which is output by said low DC voltage transformers, and supply the testing signals to the semiconductor devices under test.

With the semiconductor testing apparatus of the present invention, it is possible to save current loss in the power cable and therefore to decrease the gauge of the power cable and to reduce the cost of the equipment due to above narrower gauge power cable. In addition, it is possible for the test station to supply the low DC voltage which is required by each of the pin electronic circuit from the respective low DC voltage transformer, and in this case to share one high DC voltage transformer among the low DC voltage transformers. It is also possible to control the number of the power supply lines by the unit of the devices being tested, and to reduce the capacity of the power cable because every pin electronic circuit comprises a power supply line, and the test station has a low DC voltage transformer inside.

DESCRIPTION OF THE PREFERRED EMBODIMENTS

A. First Embodiment

Figure 1:
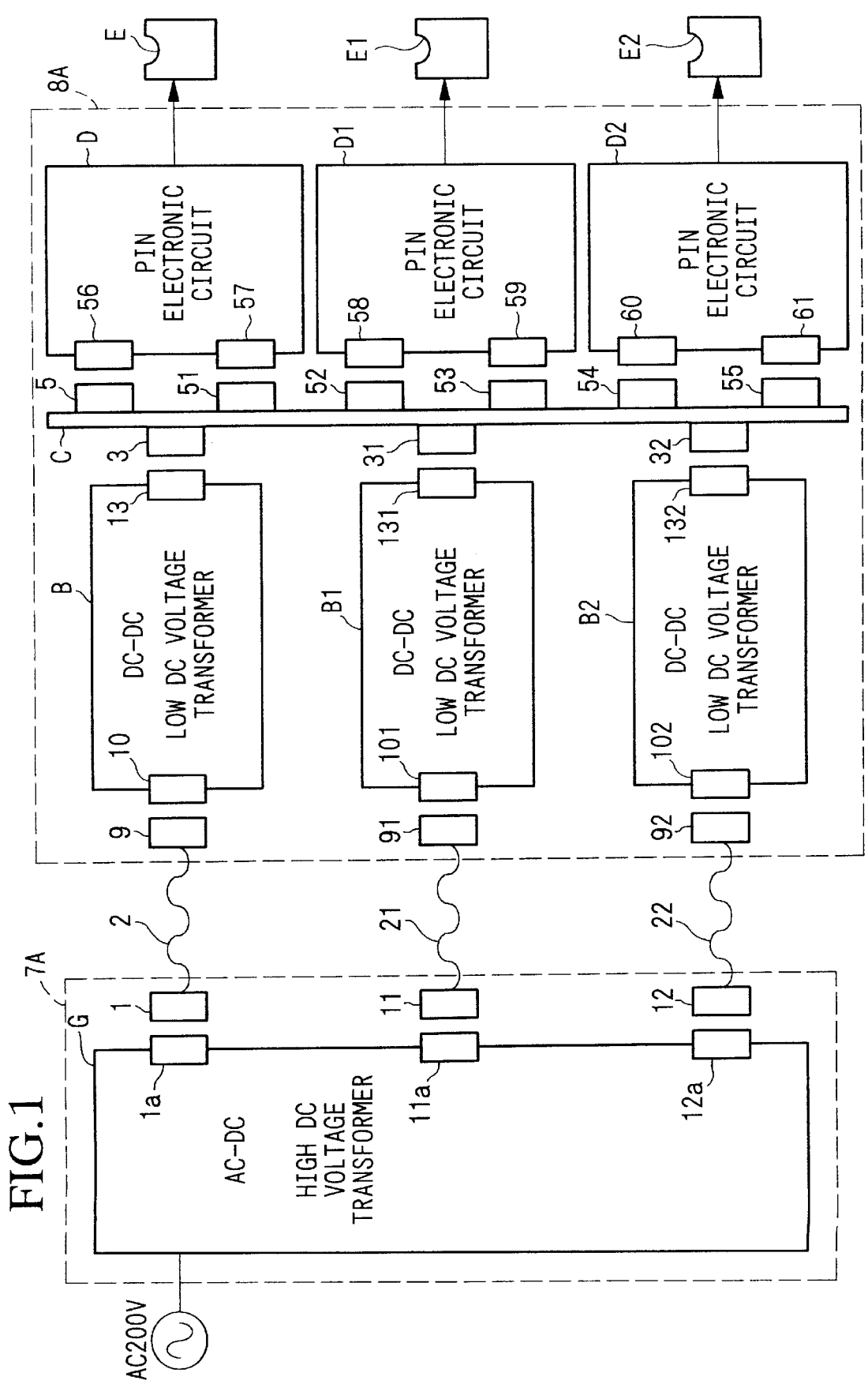
FIG. 1 is a block diagram illustrating the semiconductor testing apparatus according to an embodiment of the present invention.
Figure 4:
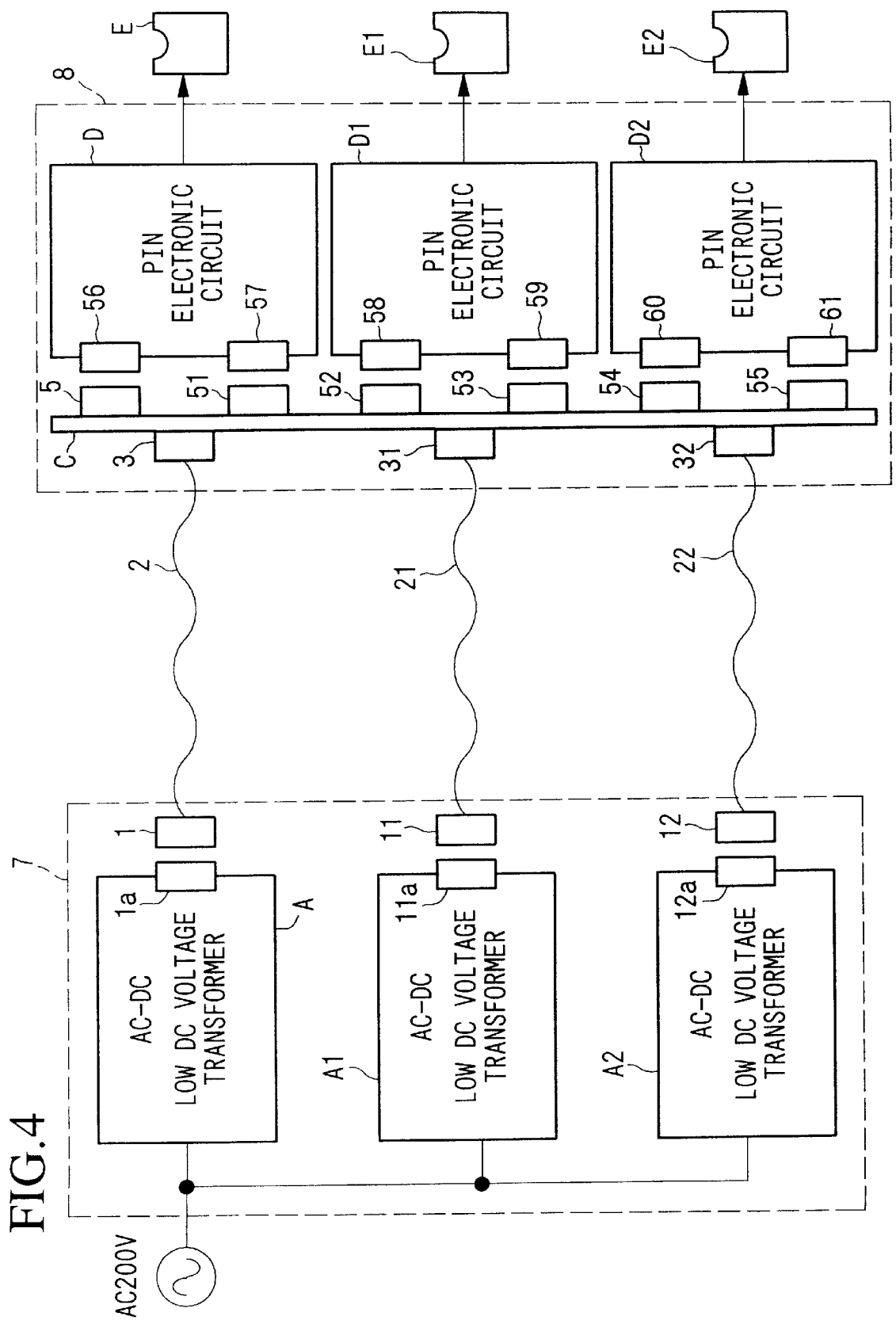
FIG. 4 is a block diagram of a conventional semiconductor testing apparatus.
Figure 5:
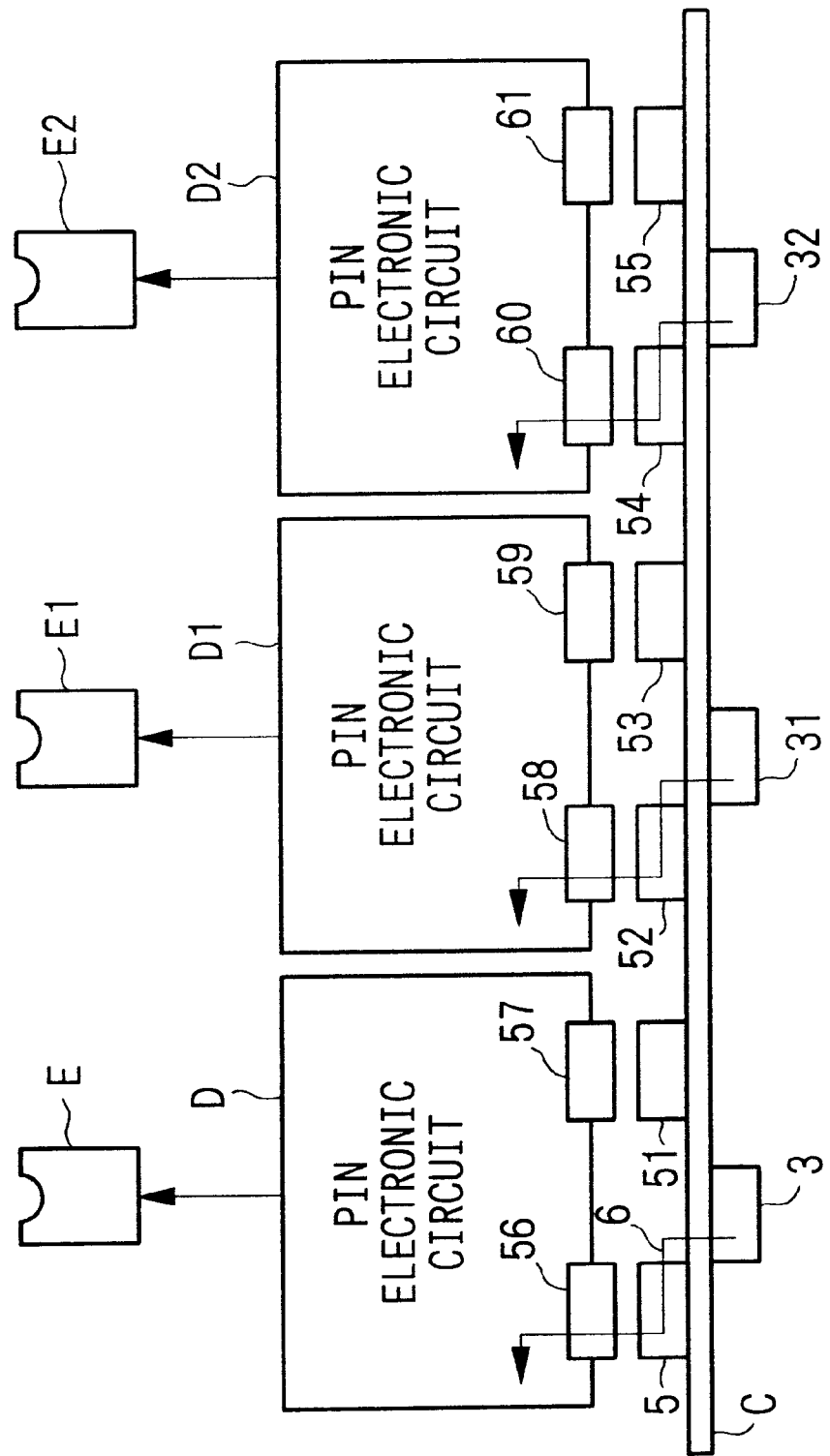
FIG. 5 is a detailed block diagram of the conventional semiconductor testing apparatus illustrated in FIG. 4.

Hereinbelow, a semiconductor testing apparatus according to the first embodiment of the present invention will be described with reference to FIG. 1, which is a block diagram illustrating the composition of the above embodiment. In FIG. 1, the explanation of the components with the same reference numbers as in FIG. 4 are omitted. High DC voltage transformer G is provided in the main body 7A and transforms the AC voltage (AC 200 V, for example) into DC voltage (DC 200 V, for example) via a rectifier (not illustrated in FIG. 1). Furthermore, it smoothes the DC voltage by eliminating ripples via a smoothing circuit (not illustrated in FIG. 1). Also the resulting DC voltage is supplied to the connectors 1a, 11a, 12a, and travels to power cable 2, 21, 22 via connectors 1, 11, 12 which are connected to the above connectors 1a, 11a, 12a.

Low DC voltage transformers B, B1, B2 are cards contained for each of the pin electronic circuits of D, D1, D2 in the test station 8A, and having connectors 10, 101, 102 respectively in which connectors 9, 91, 92 are installed. The connectors 9, 91, 92 are connected to each of the above power cables 2, 21, 22 and supply the high DC voltage (DC 200 V, for example). The above mentioned low DC voltage transformers B, B1, B2 have connectors 13, 131, 132 which are used to output the low DC voltages after low DC voltage transformers B, B1, B2 transform the high DC voltage into the respective required levels. Each of the connectors 13, 131, 132 are enable to be connected to the connectors 3, 31, 32.

Thus, each circuit is directly connected without a cable between the connectors 10, 101, 102 and pin electronic circuits D, D1, D2, respectively. Herein, the above low DC voltage transformers B, B1, B2 and pin electronic circuits D, D1, D2 are electrically connected via the above mentioned connectors, and are cards which are enable to be arbitrarily exchanged.

The following is an explanation of the operation of the first embodiment of the present invention.

First, high DC voltage transformer G which is contained in the main body 7A transforms the high AC voltage (AC 200 V, for example) into high DC voltage (DC 200 V, for example), smoothes the resulting high DC voltage, and outputs it to the power cables 2, 21, 22 via the connectors 1a, 11a, 12a and the connectors 1, 11, 12 respectively. In addition, the high DC voltage is supplied to each of the low DC voltage transformers B, B1, B2 via respective power cables 2, 21, 22; the connectors 9, 91, 92 of the test station 8A; and the connectors 10, 101, 102.

The low DC voltage transformers B, B1, B2 transform the above mentioned high DC voltages, which are all equal, into the low DC voltages which are required by the pin electronic circuits D, D1, D2. The low DC voltages after the transformation are respectively input into the pin electronic circuits D, D1, D2 via the connectors 13, 131, 132; the connectors 3, 31, 32; the respective circuit patterns on the backboard C; the connectors 5, 52, 54, and connectors 56, 58, 60 sequentially. Therefore, each of the pin electronic circuit D, D1, D2 receives each of above mentioned low DC voltages, and supplies the testing signal to each of the semiconductor devices E, E1, E2. Thus, tests such as characteristics testing of each of the semiconductor devices E, E1, E2 will be performed.

Consequently, in this preferred embodiment (first embodiment), the current capacity of the power cables 2, 21, 22 can be reduced by adding the high DC voltage from the high DC voltage transformer G to the power cable 2, 21, 22. Therefore, the power cables 2, 21, 22 can be of a narrower gauge. Also, the increase and/or the decrease of the number of the semiconductor devices E, E1, E2 can be easily solved by increasing and/or decreasing both the number of the low DC voltage transformers B, B1, B2 which consist the power supply lines and pin electronic circuits D, D1, D2. This is because each of the pin electronic circuits D, D1, D2 is disposed so as to correspond to each of the semiconductor devices E, E1, E2. Furthermore, by the possibility of inputting the high voltage to the power cables 2, 21, 22, the voltage drop can be ignored, and it allows a reduction in the capacity of the power cables 2, 21, 22, which are kept high in case of a voltage drop.

Figure 2:
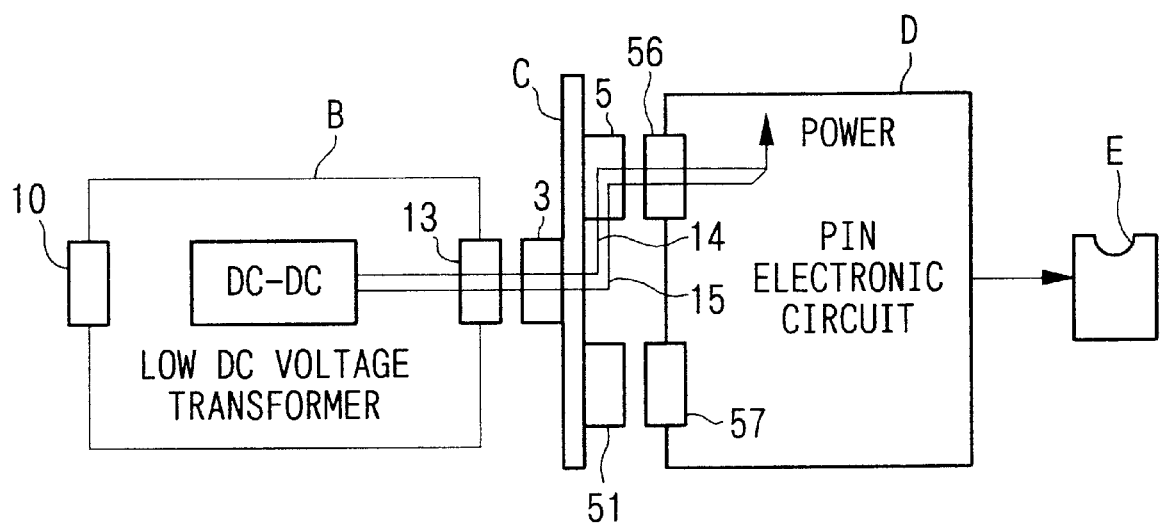
FIG. 2 is a detailed block diagram of the semiconductor testing apparatus illustrated in FIG. 1.

Next, FIG. 2 shows a detailed block diagram of the semiconductor testing apparatus illustrated in FIG. 1. The semiconductor device E corresponds one-to-one with the pin electronic circuit D in the case of FIG. 2. In FIG. 2, low DC voltage transformers B, B1, B2 are mounted directly on the back side of the backboard C via the connectors 3, 13. In addition low DC voltage is supplied sequentially to the pin electronic circuit D via each of the connectors 13 and 3, each of the circuit patterns 14 and 15 which are force line and sense line respectively mounted on the backboard C, the connectors 5 and 56. Consequently, the whole length of the power supply line can be shortened by omitting the cables, and the degree of the voltage drop can be minimized because the value of the line resistance is minimized.

Furthermore, in the case of FIG. 2, in which the semiconductor device E corresponds one-to-one to the pin electronic circuit D, the sensing of the low DC voltage can be easily performed in the pin electronic circuit D under the condition that the value of the resistor of the circuit can be ignored, because low DC voltage transformer B is independently formed. Therefore, low DC voltages which are equal and accurate can be supplied to the pin electronic circuit D according to the output of the sensing, by connecting the force line and the sense line on the pin electronic circuit D.

B. Second Embodiment

Figure 3:
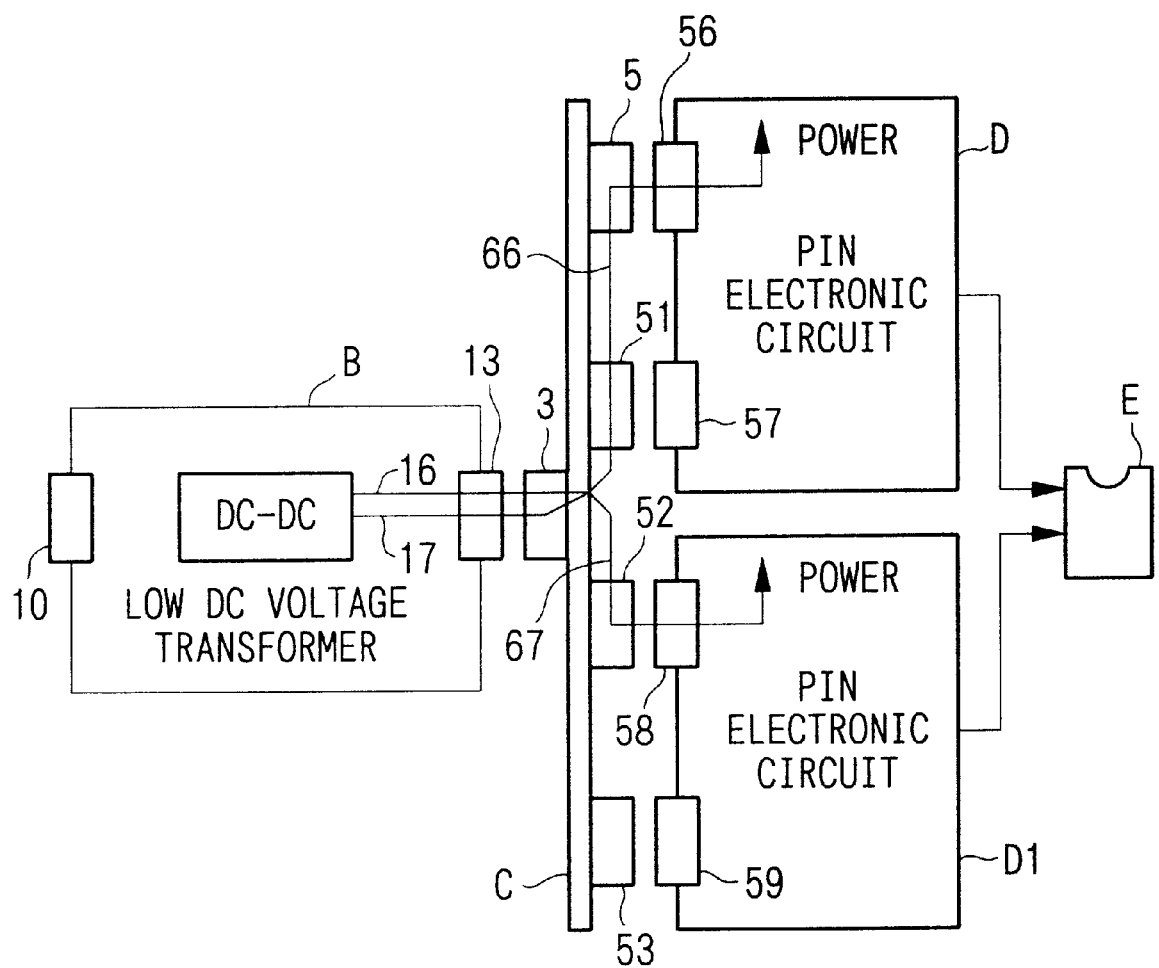
FIG. 3 is a block diagram of a major component of the semiconductor testing apparatus according to another embodiment of the present invention.

FIG. 3 shows a major component of the semiconductor testing apparatus according to the second embodiment of the present invention. It shows the case in which low DC voltages are supplied from the pin electronic circuit D and D1 to the semiconductor devices E. In FIG. 3, the force line which is output by the low DC voltage transformer B is directly connected on the backboard to the sense line. Additionally, the low DC voltage is distributed to the pin electronic circuits D and D1 via the circuit patterns 66 and 67 on the backboard C.

In the above case, a sufficient level of the testing signals can be supplied from the two pin electronic circuits D and D1 to the semiconductor device E, when the level of the testing signals is not sufficient. Moreover, also in the second embodiment, low DC voltage can be supplied allows the shortest path and with high efficiency, because low DC voltage transformer B is mounted directly on the back side of the backboard C on which the pin electronic circuits D and D1 are mounted, in the same way as in FIG. 1 and FIG. 2.

What is claimed is:

1. A semiconductor device testing apparatus comprising:
   a high DC voltage transformer for transforming high AC voltage into high DC voltage and outputting the high DC voltage;
   a plurality of low DC voltage transformers for receiving high DC voltage output by the high DC voltage transformer via a power cable, and transforming the high DC voltage into low DC voltage; and
   pin electronic circuits connected to each of said low DC voltage transformers, for receiving low DC voltage output by said low DC voltage transformers and supplying testing signals to test semiconductor devices.

2. The apparatus according to claim 1, wherein said low DC voltage transformer is connected via connectors and circuit patterns to a backboard on which said pin electronic circuits are mounted.

3. The apparatus according to claim 1, wherein said low DC voltage transformer and said pin electronic circuit are constructed on a single card.

4. The apparatus according to claim 1, wherein said high DC voltage transformer comprises a smoothing circuit.

5. The apparatus according to claim 1, wherein said pin electronic circuits are connected one-to-one to said semiconductor devices, and can detect said low DC voltage which is input to each said pin electronic circuits.

6. The apparatus according to claim 1, wherein said semiconductor device is connected a plurality of said pin electronic circuits.

* * * * *